US012750994B2

(12) United States Patent
Kwon

(10) Patent No.: US 12,750,994 B2
(45) Date of Patent: Sep. 29, 2026

(54) DISPLAY DEVICE INCLUDING A DISPLAY PANEL HAVING A COVER FILM

(71) Applicant: SAMSUNG DISPLAY CO., LTD., Yongin-si (KR)

(72) Inventor: Hyeok Tae Kwon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 57 days.

(21) Appl. No.: 18/911,647

(22) Filed: Oct. 10, 2024

(65) Prior Publication Data

US 2025/0159851 A1 May 15, 2025

(30) Foreign Application Priority Data

Nov. 13, 2023 (KR) ........................ 10-2023-0156659

(51) Int. Cl.
*H05K 9/00* (2006.01)
*G06F 3/044* (2006.01)

(52) U.S. Cl.
CPC ......... *H05K 9/0079* (2013.01); *G06F 3/0443* (2019.05); *H05K 9/0054* (2013.01)

(58) Field of Classification Search
CPC ...... H05K 9/00; H05K 9/0079; H05K 9/0054; H05K 1/189; H05K 9/0067; G06F 3/044; G06F 3/0443; H10K 59/80; H10K 59/872; G09G 3/32
USPC .................................................. 361/212, 220
See application file for complete search history.

(56) References Cited

U.S. PATENT DOCUMENTS

2020/0341591 A1* 10/2020 You ........................ G06F 3/0443
2024/0349575 A1* 10/2024 Zhu .................... H10K 59/8792

FOREIGN PATENT DOCUMENTS

KR 10-2017-0113788 A 10/2017

* cited by examiner

*Primary Examiner* — Danny Nguyen
(74) *Attorney, Agent, or Firm* — F. CHAU & ASSOCIATES, LLC

(57) ABSTRACT

A display device includes a display panel including a first surface and a second surface opposite to the first surface. A cover film includes a first portion disposed on the first surface of the display panel, a second portion disposed on a side surface of the display panel, the side surface being between the first surface and the second surface and at least a portion of the second portion being bent, and a third portion disposed on the second surface of the display panel. The cover film includes a first insulating cover layer, a conductive cover layer disposed on the first insulating cover layer, and a second insulating cover layer disposed on the conductive cover layer. The second insulating cover layer includes an opening exposing the conductive layer.

20 Claims, 7 Drawing Sheets

DISPLAY DEVICE INCLUDING A DISPLAY PANEL HAVING A COVER FILM

CROSS-REFERENCE TO RELATED APPLICATIONS

This application claims priority under 35 U.S.C. § 119 to Korean Patent Application No. 10-2023-0156659, filed on Nov. 13, 2023 in the Korean Intellectual Property Office, the disclosure of which is incorporated by reference herein in its entirety.

TECHNICAL FIELD

The present disclosure relates to a display device and, more specifically, to a display device including a display panel having a cover film.

DISCUSSION OF THE RELATED ART

Display devices may include a plurality of conductive structures. In the case where an electro-static discharge (ESD) phenomenon occurs adjacent to a conductive structure, the conductive structure may be damaged, thus leading to a reduction in the reliability of electrical signals.

Accordingly, methods for dissipating ESD have been explored.

SUMMARY

A display device includes a display panel including a first surface and a second surface. A cover film includes a first portion disposed on the first surface of the display panel, a second portion disposed on a side surface of the display panel, the side surface being between the first surface and the second surface and at least a portion of the second portion being bent, and a third portion disposed on the second surface of the display panel. The cover film includes a first insulating cover layer, a conductive cover layer disposed on the first insulating cover layer, and a second insulating cover layer disposed on the conductive cover layer. The second insulating cover layer includes an opening exposing the conductive layer.

The conductive cover layer may form an electro-static discharge (ESD) path to dissipate ESD from along the opening.

The opening may be formed in the first portion and may be absent from each of the second portion and the third portion.

The opening may include a plurality of openings.

The plurality of openings may be arranged in a matrix structure with respect to a first direction and a second direction different from the first direction.

The plurality of openings may be sequentially arranged in a given direction.

The plurality of openings may include a first opening and a second opening. The size of the first opening may be greater than the size of the second opening.

The first opening may include first side openings and a first intermediate opening between the first side openings. The first side openings and the first intermediate opening may be adjacent to each other in a given direction. The size of each of the first side openings may be greater than the size of the first intermediate opening.

The second opening may include a plurality of second openings. The plurality of second openings may be arranged in a matrix structure with respect to a first direction and a second direction different from the first direction.

The opening may include only a single opening.

The opening may have a shape extending primarily in a given direction.

The first insulating cover layer may have a first thickness. The second insulating cover layer may have a second thickness that is less than the first thickness.

The display device may further include a display area, and a non-display area enclosing at least a portion of the display area, and a sensing layer disposed on the display panel, and including a sensing electrode, and a sensing line electrically connected to the sensing electrode.

The sensing line may be disposed in the non-display area.

The opening may be adjacent to the sensing line.

The display device may further include a polarizing layer disposed on the sensing layer.

The sensing line and the polarizing layer may overlap each other.

The display panel may include a pixel. The display device may further include a driving circuit component configured to drive the pixel. The sensing line may be disposed between the display area and the driving circuit component.

The first portion may cover the driving circuit component.

The display device may further include a circuit substrate disposed on the second surface of the display panel and a curved film, at least a first portion of which is disposed on the display panel, and at least a second portion of which disposed circuit substrate. The second portion may cover the curved film. The third portion may cover the curved film and the circuit substrate.

The display device may be a windowless structure.

A windowless display device includes a display panel including a first surface and a second surface. A sensing layer is disposed on the display panel, and includes a sensing electrode, and a sensing line electrically connected to the sensing electrode. A polarizing layer is disposed on the sensing layer. At least a portion of a cover film, is disposed on the display panel. The cover film includes a first insulating cover layer, a conductive cover layer disposed on the first insulating cover layer, and a second insulating cover layer disposed on the conductive cover layer. The second insulating cover layer includes an opening exposing the conductive layer. The opening includes a plurality of openings. At least some of the plurality of openings are sequentially formed in a direction in which the sensing line extends.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
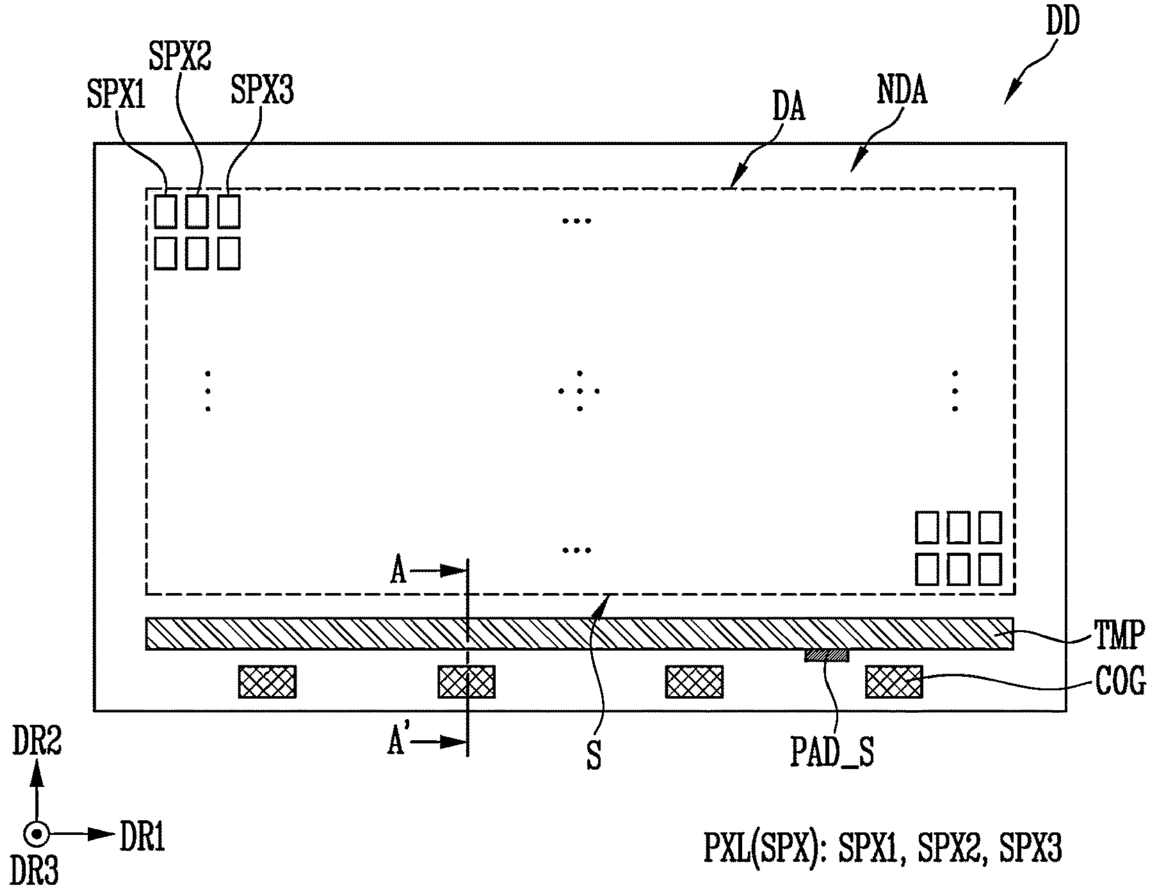
FIG. 1 is a schematic plan view illustrating a display device in accordance with an embodiment of the present disclosure.

As the present disclosure allows for various changes and numerous embodiments, particular embodiments will be illustrated in the drawings and described in detail in the written description. However, the present disclosure is not necessarily limited to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not necessarily be limited by these terms. These terms are used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in the present disclosure, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not necessarily limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Various embodiments of the present disclosure relates to a display device. Hereinafter, a display device in accordance with an embodiment will be described with reference to the attached drawings.

FIG. 1 is a schematic plan view illustrating a display device DD in accordance with an embodiment of the present disclosure.

Referring to FIG. 1, the display device DD may include a base layer, and pixels PXL disposed on the base layer. The display device DD may further include a driving circuit component COG, lines, and pads. In an embodiment of the present disclosure, the lines may include a sensing line TMP. The pads may include a sensing pad PAD_S.

The display device DD (or the base layer) may include a display area DA and a non-display area NDA. The non-display area NDA may refer to an area other than the display area DA. The non-display area NDA may enclose at least a portion of the display area DA.

The base layer may form a base surface of the display device DD. The base layer may be a rigid or flexible substrate or film. For example, the base layer may include glass. Alternatively, the base layer may include silicon. As a further alternatively, the base layer may include polyimide. However, the present disclosure is not necessarily limited to the aforementioned examples.

The display area DA may refer to an area in which the pixels PXL are disposed. The non-display area NDA may refer to an area in which the pixels PXL are not disposed. The driving circuit component, the lines, and the pads which are connected to the pixels PXL of the display area DA may be disposed in the non-display area NDA.

In accordance with an embodiment of the present disclosure, the pixels PXL (or the sub-pixels SPX) may be arranged in a stripe or PENTILE™ arrangement structure or the like, but the present disclosure is not necessarily limited thereto. PENTILE™ is an arrangement of luminous areas used in display devices manufactured by SAMSUNG. Various embodiments may be applied to the present disclosure.

In accordance with an embodiment of the present disclosure, each pixel PXL (or the sub-pixels SPX) may include a first sub-pixel SPX1, a second sub-pixel SPX2, and a third sub-pixel SPX3. Each of the first sub-pixel SPX1, the second sub-pixel SPX2, and the third sub-pixel SPX3 may be a sub-pixel. At least one first sub-pixel SPX1, at least one second sub-pixel SPX2, and at least one third sub-pixel SPX3 may form a pixel unit which may emit various colors of light.

Each of the first sub-pixel SPX1, the second sub-pixel SPX2, and the third sub-pixel SPX3 may emit light of a single color.

For instance, the first sub-pixel SPX1 may be a red pixel configured to emit red light (e.g., first color), the second sub-pixel SPX2 may be a green pixel configured to emit green light (e.g., second color), and the third sub-pixel SPX3 may be a blue pixel configured to emit blue light (e.g., third color). The red pixel may provide light in a wavelength band ranging from 600 nm to 750 nm. The green pixel may provide light in a wavelength band ranging from 480 nm to 560 nm. The blue pixel may provide light in a wavelength band ranging from 370 nm to 460 nm.

In accordance with an embodiment of the present disclosure, the number of second sub-pixels SPX2 may be greater than the number of first sub-pixels SPX1, or the number of third sub-pixels SPX3. The colors, types, and/or numbers of first sub-pixels SPX1, second sub-pixels SPX2, and the third sub-pixels SPX3 which form each pixel unit are not necessarily limited to a specific example.

The driving circuit component COG may be disposed on a side S of the display area DA. The driving circuit component COG may be disposed in the non-display area NDA, and may be placed outside the sensing line TMP.

The driving circuit component COG may include a scan driver, a data driver, and a sensor driver (e.g., a touch driver). The scan driver may be configured to supply scan signals to the pixels PXL. The data driver may be configured to supply data signals to the pixels PXL. In an embodiment of the present disclosure, each pixel PXL may be electrically connected to the driving circuit component COG, and may emit light based on an electrical signal provided from the driving circuit component COG.

At least a portion of the sensing line TMP may be placed on the side S of the display area DA. The sensing line TMP may be disposed in the non-display area NDA, and may be placed inside the driving circuit component COG. The sensing line TMP may extend from the non-display area NDA in a first direction DR1. Hence, the sensing line TMP may be adjacent to the driving circuit component COG, and may be adjacent to an edge of the display device DD.

The sensing line TMP may include conductive material, and may be electrically connected to a sensing electrode SP (refer to FIG. 3) included in the display device DD. The sensing electrode SP may be configured to acquire information about a touch input from a user. The information about the touch input may include an electrical signal based on a touch provided from the user. For example, the sensing electrode SP may include first and second sensing electrodes, and may operate in a mutual capacitance manner or operate in a self-capacitance manner. The sensing electrode SP may be disposed in an area, thus forming a touch active area. The touch active area may overlap the display area DA on a plane. In this specification, the term "plane" may refer to a plane extending in the first direction DR1 and a second direction DR2.

The sensing line TMP may be electrically connected to the sensing pad PAD_S. The sensing pad PADS may be electrically connected to the sensor driver. Hence, the sensor driver and the sensing electrode SP may be electrically connected to each other through the sensing pad PAD_S and the sensing line TMP. The sensor driver may supply a sensing driving signal to the sensing electrode SP. The sensing electrode SP may supply a sensing signal to the sensor driver.

Figure 2:
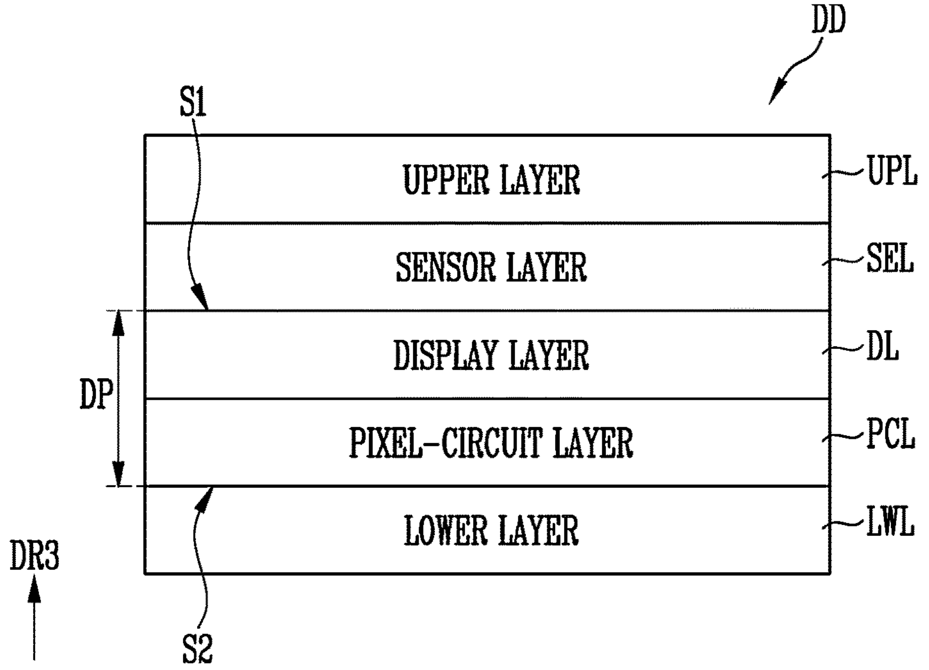
FIG. 2 is a schematic cross-sectional view illustrating a display device in accordance with an embodiment of the present disclosure.

FIG. 2 is a schematic cross-sectional view illustrating a display device DD in accordance with an embodiment of the present disclosure.

Referring to FIG. 2, the display device DD may include a display panel DP, a lower layer LWL, a sensor layer SEL, and an upper layer UPL.

The display panel DP may be configured to emit light. The display panel DP may include a pixel-circuit layer PCL and a display layer DL. The display panel DP may include a first surface S1 that forms a front surface, and a second surface S2, opposite to the first surface S1, that forms a rear surface.

The pixel-circuit layer PCL may be a layer including a pixel circuit configured to drive the pixels PXL. The pixel-circuit layer PCL may include a backplane layer. For example, the pixel-circuit layer PCL may include a base layer and a pixel circuit disposed on the base layer. The pixel-circuit layer PCL may include conductive layers and insulating layers. The conductive layers may form the pixel circuit. The pixel circuit may include circuit elements configured to drive sub-pixels SPX, or light emitting elements LD (refer to FIG. 3).

The display layer DL may be disposed on the pixel-circuit layer PCL. The display layer DL may include the light emitting elements LD. Each light emitting element LD may include an inorganic light emitting diode including inorganic material, or may include an organic light emitting diode including organic material. However, the present disclosure is not necessarily limited to a specific example.

The lower layer LWL may be disposed on the second surface S2 of the display panel DP. The lower layer LWL may form a base allowing a circuit substrate PCB (refer to FIG. 3) to be disposed thereon. In an embodiment of the present disclosure, the lower layer LWL may include various materials. For example, the lower layer LWL may include a heat dissipation layer. However, the present disclosure is not necessarily limited to the aforementioned example.

The sensor layer SEL may be disposed on the first surface S1 of the display panel DP. The sensing layer SEL may be configured to acquire information about a touch input from the user. The sensor layer SEL may include the sensing electrode SP and the sensing line TMP.

The upper layer UPL may be disposed on the sensor layer SEL. The upper layer UPL may form an outer layer of the display device DD with respect to a direction in which light is emitted (e.g., in a third direction DR3). For example, the upper layer UPL may include a polarizing layer POL. The polarizing layer POL may include material having various polarizing properties. For example, the polarizing layer POL may include a phase delay layer, and may also include a wire grid polarizing layer.

In an embodiment of the present disclosure, the upper layer UPL might not include a window structure. Hence, the display device DD may be implemented as a windowless display device. In an embodiment of the present disclosure, due to the exclusion of the window structure, the display device DD may achieve a lightweight characteristic, and the reliability of information about emitted light can be further enhanced.

In conventional display devices, the window structure functions as an electro-static discharge (ESD) path, and as a result, in the case where the display device DD is implemented as a windowless display device, there may be an increased risk of ESD damaging the sensing line TMP. However, in an embodiment of the present disclosure, the display device DD may include an ESD prevention structure, thus leading to a reduction of the risk of ESD damage. With regard to this, details will be explained with reference to FIG. 3 and the following drawings.

Figure 3:
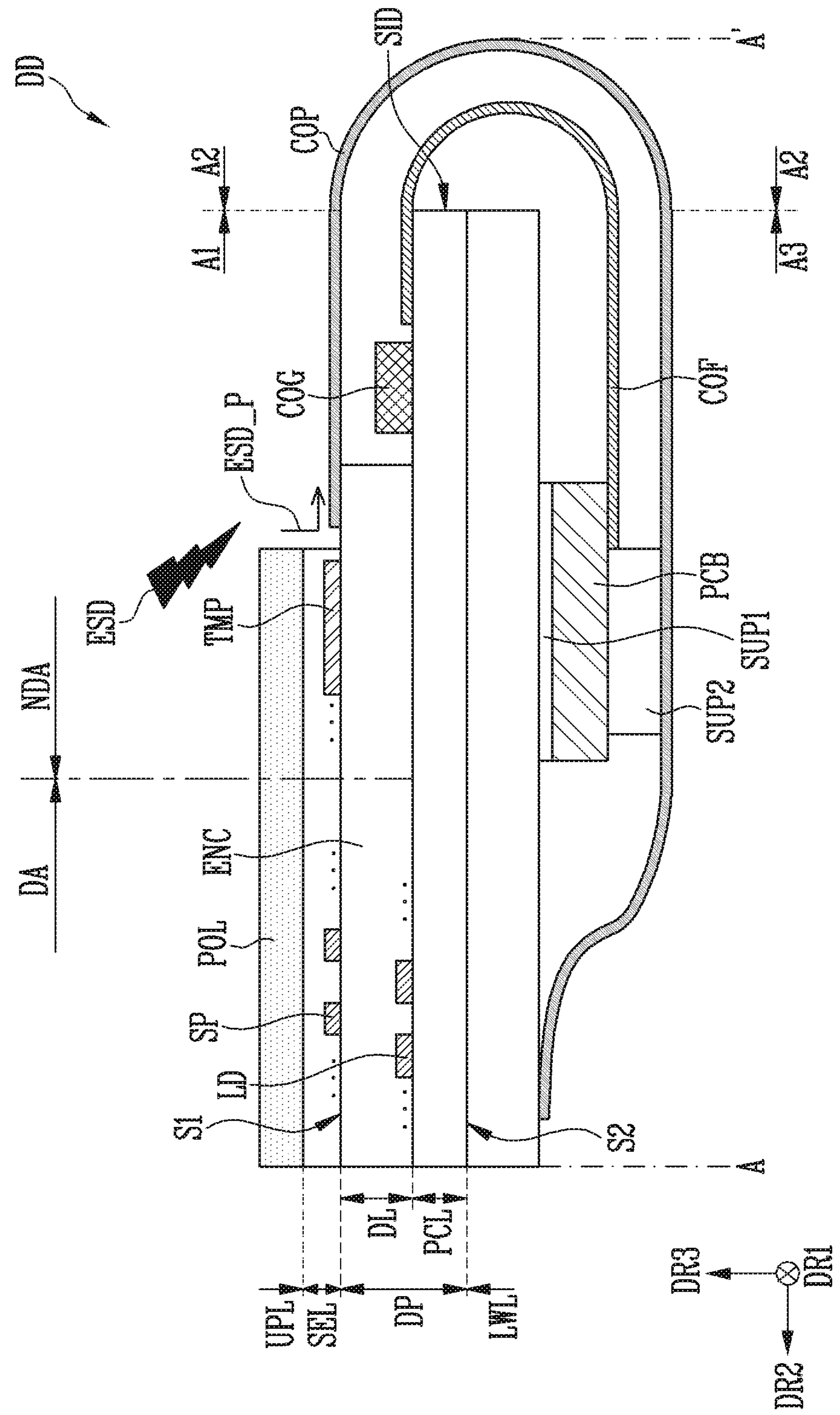
FIG. 3 is a schematic cross-sectional view taken along line A-A' of FIG. 1.

FIG. 3 is a schematic cross-sectional view taken along line A-A' of FIG. 1. FIG. 3 schematically illustrates a cross-sectional structure for components adjacent to the side S of the display area DA. For example, FIG. 3 illustrates components of the display device DD disposed over the display area DA and the non-display area NDA.

Referring to FIG. 3, the driving circuit component COG may be disposed on the pixel-circuit layer PCL in the non-display area NDA. In an embodiment of the present disclosure, the driving circuit component COG may be disposed in the same layer as the display layer DL.

The display layer DL may include the light emitting elements LD disposed in the display area DA, and may also include an encapsulation layer ENC that covers the light emitting elements LD. The encapsulation layer ENC may be continuously disposed in the display area DA and the non-display area NDA.

The sensor layer SEL may be disposed on a portion of the display layer DL. The sensing line TMP may be adjacent to an edge of the sensor layer SEL. For example, the sensing line TMP may be adjacent to a cover film COP.

The polarizing layer POL may overlap the sensor layer SEL in a plan view. In an embodiment of the present disclosure, the polarizing layer POL may overlap the sensor line TMP, in a plan view. However, the present disclosure is not necessarily limited to the aforementioned example. In an embodiment of the present disclosure, the polarizing layer POL might not overlap the sensing line TMP.

In accordance with an embodiment of the present disclosure, the display device DD may further include a curved film COF, a circuit substrate PCB, and the cover film COP.

The curved film COF may be bent on at least a portion thereof. A portion of the curved film COF may be placed on the pixel-circuit layer PCL, and another portion of the curved film COF may be placed on the circuit substrate PCB. In an embodiment of the present disclosure, the curved film COF may be electrically connected to at least some conductive structure (e.g., lines, pads, or the like) of the display panel DP, and may be electrically connected to the circuit substrate PCB. In an embodiment of the present disclosure, the curved film COF may be a chip-on-film.

The circuit substrate PCB may be disposed on the lower layer LWL. The circuit substrate PCB may be fixed on the lower layer LWL through a first support structure SUP1. The circuit substrate PCB may include a flexible circuit substrate. The circuit substrate PCB may be configured to control overall operations of the display device DD.

The cover film COP may cover a side surface SID of the display panel DP. The cover film COP may cover the driving circuit component COG, may cover a curved film COF, and may cover the circuit substrate PCB.

In an embodiment of the present disclosure, at least a portion of the cover film COP may be bent. For example, the cover film COP may include a first portion A1 (or a first area), a second portion A2 (or a second area), and a third portion A3 (or a third area).

The first portion A1 of the cover film COP may be disposed on the first surface S1 of the display panel DP. The first portion A1 may extend in the display area NDA, and may cover the driving circuit component COG and a portion of the curved film COF. In an embodiment of the present disclosure, the first portion A1 may neither overlap the sensor line TMP nor the polarizing layer POL, in a plan view.

The second portion A2 of the cover film COP may be bent. The second portion A2 may cover the side surface SID of the display panel DP and the curved film COF.

The third portion A3 of the cover film COP may be disposed on the second surface S2 of the display panel DP. At least a portion of the second portion A2 may extend in the non-display area NDA. Another portion of the second portion A2 may extend in the display area DA. The second portion A2 may cover the circuit substrate PCB and a portion of the curved film COF.

As described above, the sensing line TMP may be disposed substantially on a peripheral portion. Accordingly, in the case where ESD occurs, there may be a risk of interference of electrical signals supplied to the sensing line TMP due to the ESD. In this case, the sensing signals may be damaged, thus leading to occurrence of touch defects on the display device DD.

However, in an embodiment of the present disclosure, the cover film COP may form an ESD path ESD_P capable of reducing the ESD risk. With regard to this, further details will be described with reference to FIGS. 4 to 9.

Figure 4:
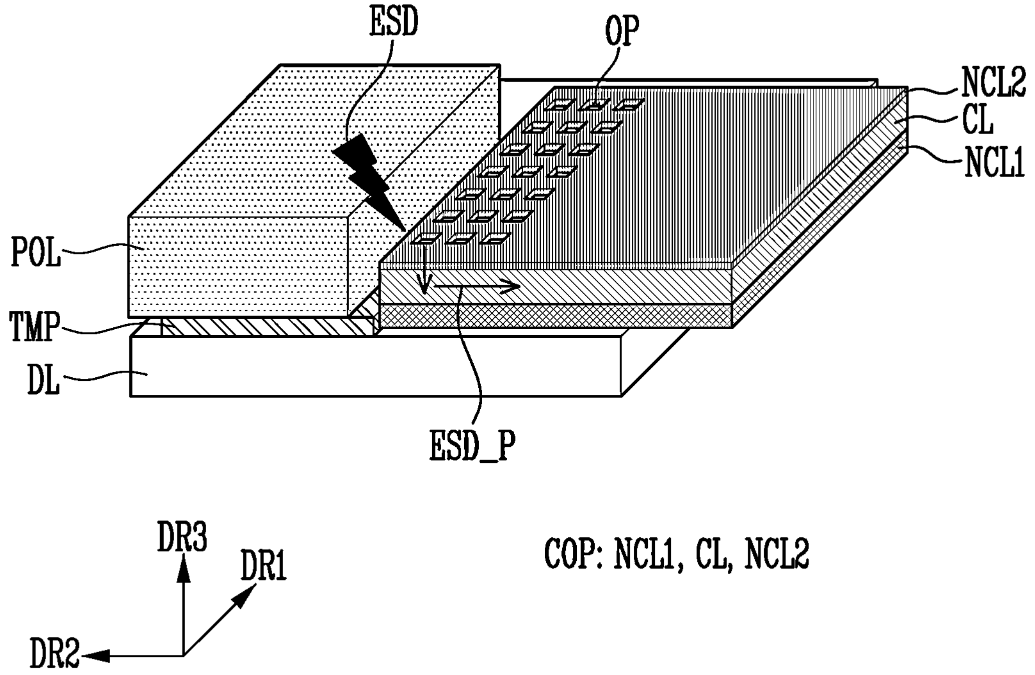
FIG. 4 is a schematic perspective view illustrating a display device in accordance with an embodiment of the present disclosure.
Figure 5:
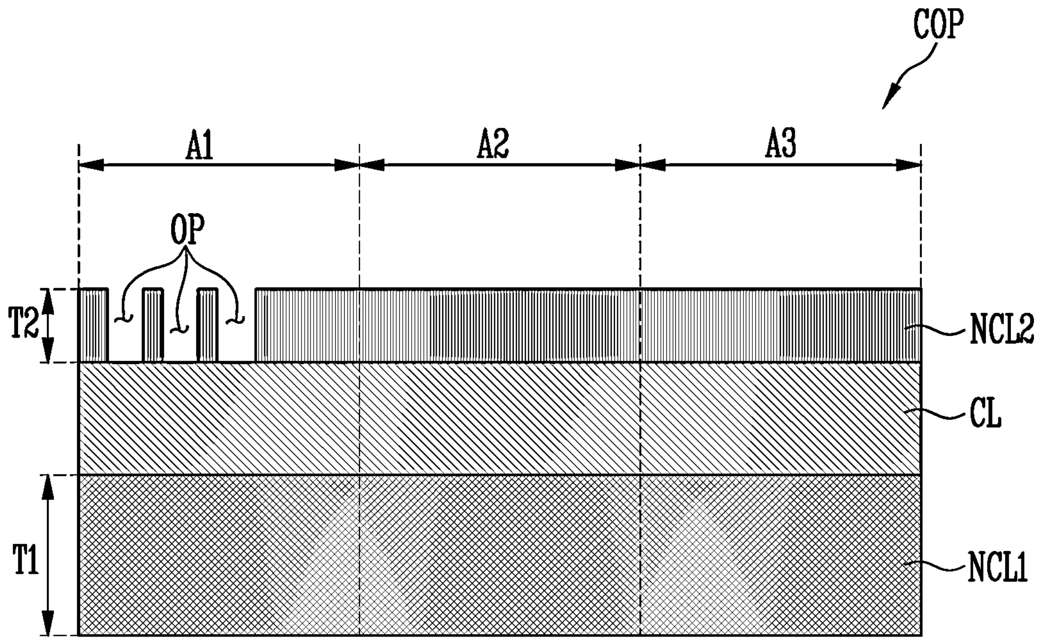
FIG. 5 is a schematic cross-sectional view illustrating a cover film in accordance with an embodiment of the present disclosure.
Figure 6:
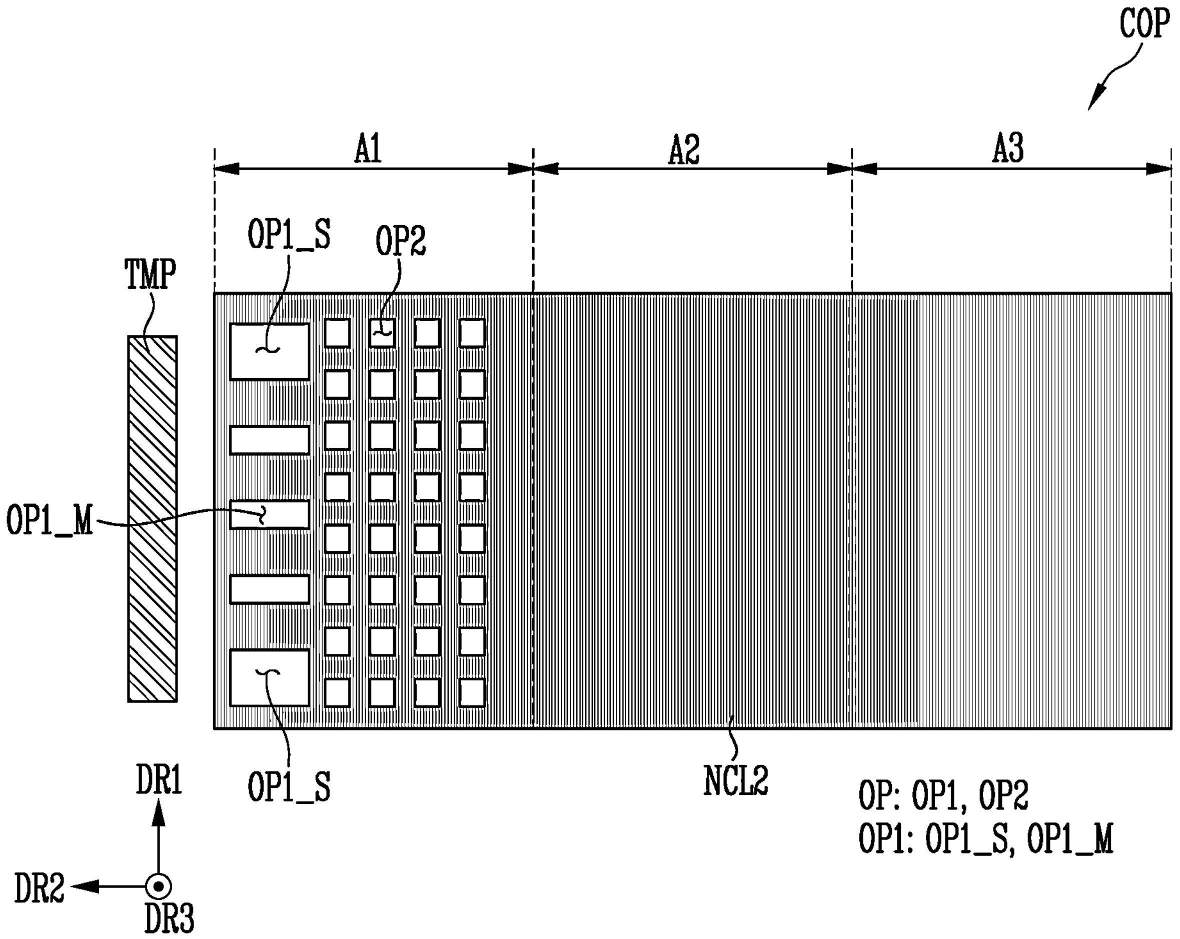
FIGS. 6 to 9 are schematic views each illustrating a cover film in accordance with an embodiment of the present disclosure.
Figure 7:
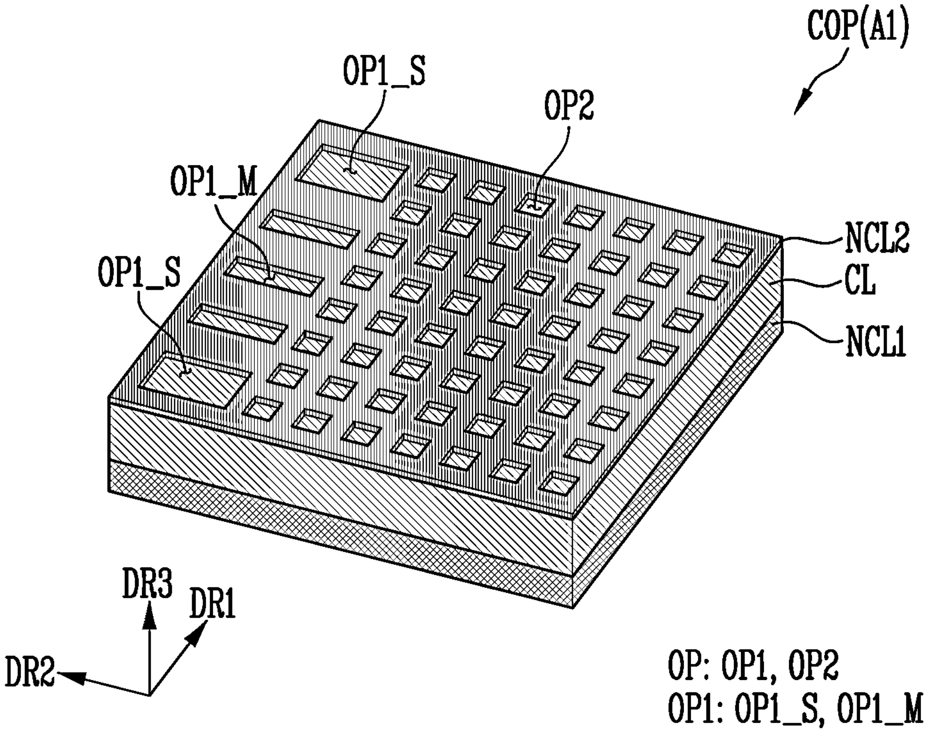
Figure 8:
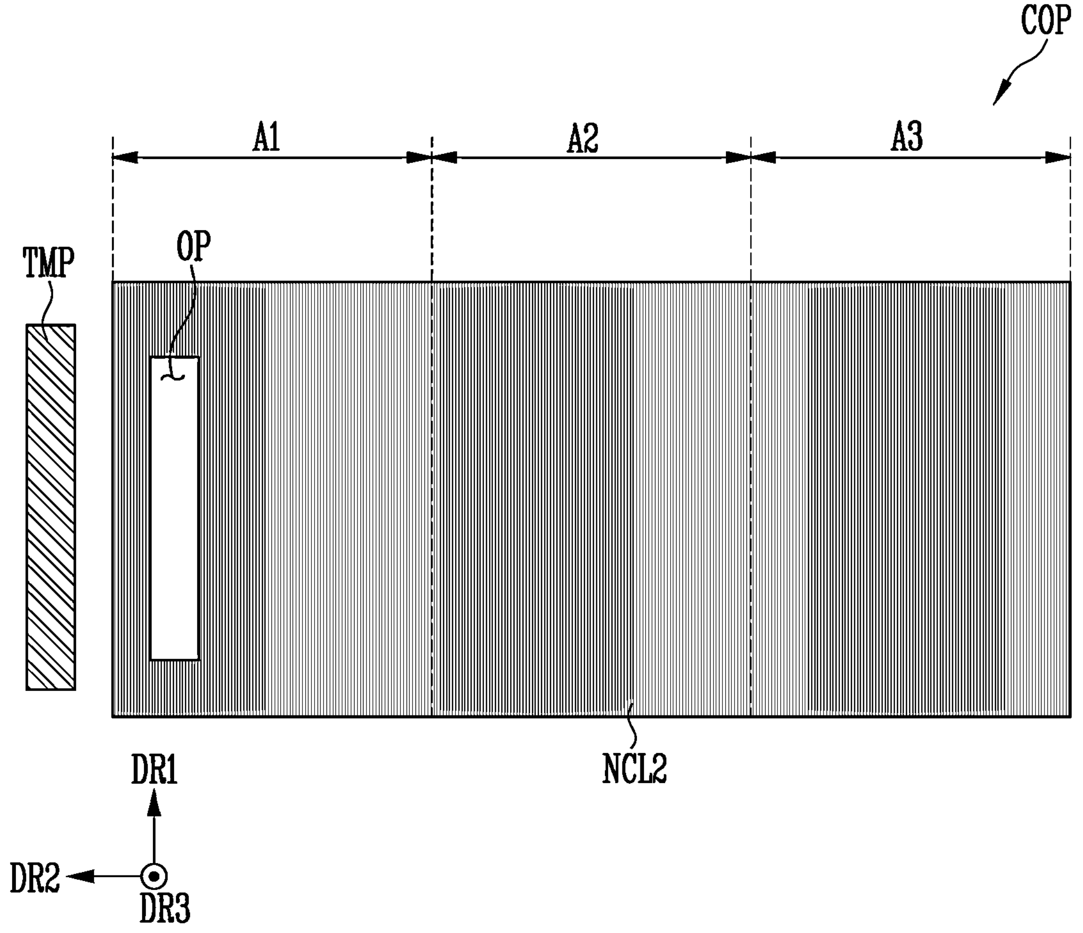
Figure 9:
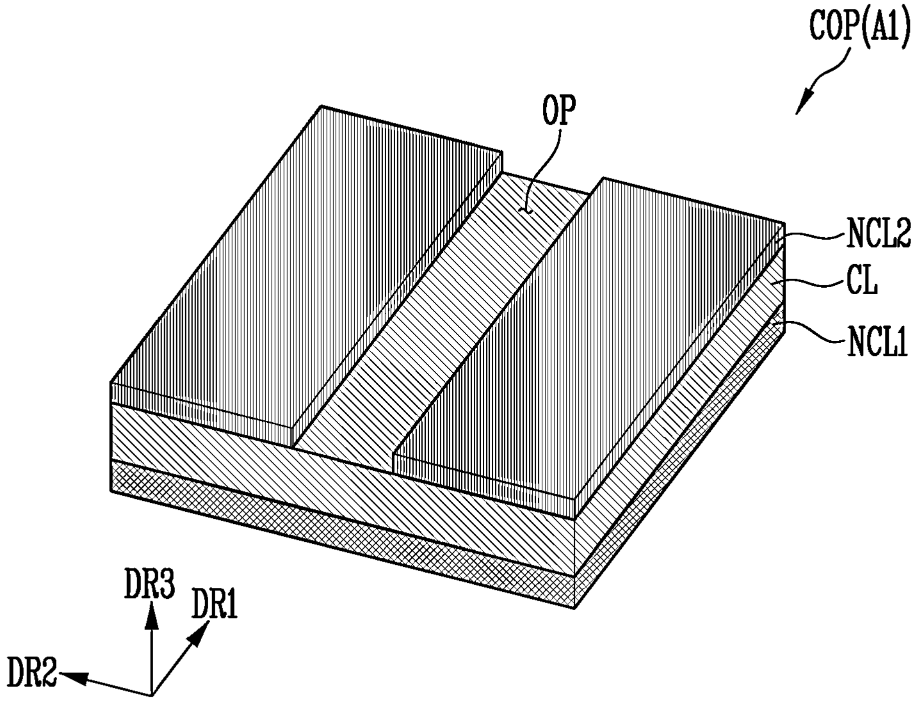

FIG. 4 is a schematic perspective view illustrating the display device in accordance with an embodiment of the present disclosure. FIG. 5 is a schematic cross-sectional view illustrating a cover film COP in accordance with an embodiment of the present disclosure. FIGS. 6 to 9 are schematic views each illustrating a cover film COP in accordance with an embodiment of the present disclosure. FIGS. 6 and 7 schematically illustrate a cover film COP in accordance with another embodiment. FIGS. 8 and 9 schematically illustrate a cover film COP in accordance with another embodiment.

Referring to FIGS. 4 and 5, the cover film COP may include a multilayer structure that forms the ESD path ESD_P. For example, the cover film COP may include a first insulating cover layer NCL1, a conductive cover layer CL, and a second insulating cover layer NCL2.

The first insulating cover layer NCL1 may be disposed on the first surface S1 of the display layer DL. In an embodiment of the present disclosure, the first insulating cover layer NCL1 may be adjacent to the sensing line TMP in a planar direction. The first insulating cover layer NCL1 may form a lower component of the cover film COP.

The first insulating cover layer NCL1 may include insulating material. For example, the first insulating cover layer NCL1 may include organic material or inorganic material. The first insulating cover layer NCL1 may include polyethylene terephthalate, polyimide, polycarbonate, polyethylene, polypropylene, polysulfone, polymethyl methacrylate, triacetate cellulose, and/or cyclic olefin polymer. However, the present disclosure is not necessarily limited to the aforementioned example.

The conductive cover layer CL may be disposed between the first insulating cover layer NCL1 and the second insulating cover layer NCL2. The conductive cover layer CL may form an intermediate component of the cover film COP.

The conductive cover layer CL may include conductive material. For example, the conductive cover layer CL may include gold (Au), silver (Ag), aluminum (Al), molybdenum (Mo), chromium (Cr), titanium (Ti), nickel (Ni), neodymium (Nd), copper (Cu), and/or platinum (Pt). However, the present disclosure is not necessarily limited to the aforementioned example.

The conductive cover layer CL may form the ESD path ESD_P. For example, the conductive cover layer CL may be exposed in an opening OP, and ESD may be applied to the conductive cover layer CL through the opening OP. The ESD provided to the conductive cover layer CL may travel through the conductive cover layer CL and then be discharged to the outside. Alternatively, in an embodiment of the present disclosure, the conductive cover layer CL may be electrically connected to a grounding component provided in the display device DD, thus allowing ESD to travel to the grounding component through the conductive cover layer CL, thereby reducing ESD.

Particularly, the ESD path ESD_P may be oriented toward an area where the sensing line TMP is not disposed. Accordingly, the risk of ESD with regard to the sensing line TMP can be reduced.

The second insulating cover layer NCL2 may be disposed on the conductive cover layer CL. In an embodiment of the present disclosure, the second insulating cover layer NCL2 may be adjacent to the polarizing layer POL in a planar direction. The second insulating cover layer NCL2 may form an upper component of the cover film COP.

The second insulating cover layer NCL2 may include insulating material. For example, the second insulating cover layer NCL1 may include organic material or inorganic material. The second insulating cover layer NCL2 may include polyethylene terephthalate, polyimide, polycarbonate, polyethylene, polypropylene, polysulfone, polymethyl methacrylate, triacetate cellulose, and/or cyclic olefin polymer. However, the present disclosure is not necessarily limited to the aforementioned example.

The second insulating cover layer NCL2 may form (or include) the opening OP. The opening OP may expose the conductive cover layer CL. As described above, the opening OP may expose the conductive cover layer CL, thus defining a path along which ESD can be applied.

The opening OP may include a single opening OP, or may include a plurality of openings OP.

As described above, the cover film COP may include the first portion A1, the second portion A2, and the third portion A3. The opening OP may be formed in the first portion A1. The opening OP might not be formed in the second and third portions A2 and A3.

In an embodiment of the present disclosure, the openings OP may be arranged in a mesh structure. For example, the openings OP may be arranged in a matrix structure in the first direction DR1 and the second direction DR2. Accordingly, the ESD discharge path ESD_P may include a plurality of paths so that ESD can be efficiently reduced.

In an embodiment of the present disclosure, the opening OP may be formed adjacent to a side (or an edge) of the cover film COP that faces the sensing line TMP and the polarizing layer POL. For example, the opening OP may include a plurality of openings OP. The openings OP may be sequentially formed in the first direction DR1, and distributed around the edge of the cover film COP.

In an embodiment of the present disclosure, the first insulating cover layer NCL1 may have a first thickness T1. The second insulating cover layer NCL2 may have a second thickness T2. The second thickness T2 may be less than the first thickness T1. A layer in which the opening OP is formed may be fabricated to have a thickness that is less than a layer in which the opening OP is not formed, thus leading to increased process convenience.

An example of the structure of the opening OP will be described with reference to FIGS. 6 and 7. FIGS. 6 and 7 illustrate the first portion A1 of the cover film COP.

In an embodiment of the present disclosure, the opening OP may include openings OP having different sizes. For example, the opening OP may include a first opening OP1, and a second opening OP2 less than the first opening OP1.

The first opening OP1 may have a comparatively large opening structure, and may be disposed between the sensing line TMP and the second opening OP2. Hence, the first opening OP1 formed adjacent to the sensing line TMP may have a substantially large size. As a result, the sensing line TMP may be more effectively protected from ESD.

The first opening OP1 may include first openings OP1 that are sequentially arranged in a direction in which the sensing line TMP extends (e.g., in the first direction DR1). Hence, the first openings OP1 having a substantially large size may cover a side of the sensing line TMP, and an entrance portion of the ESD discharge path ESD_P may be precisely defined in areas adjacent to the sensing line TMP.

In an embodiment of the present disclosure, the first opening OP1 may include first openings OP1 having different sizes. For example, the first opening OP1 may include a first side opening OP1_S and a first intermediate opening OP1_M.

In an embodiment of the present disclosure, the first intermediate opening OP1_M may be positioned between first side openings OP1_S formed on opposite sides of the cover film COP with respect to the first direction DR1. The first side opening OP1_S may be larger than the first intermediate opening OP1_M.

ESD may occur on the opposite sides of the cover film COP with respect to the first direction DR1. In an embodiment of the present disclosure, in an area where there is a concern about ESD occurrence, the size of the first opening OP1 may be formed larger, and the ESD risk may be more effectively prevented.

A plurality of second openings OP2 may be arranged in a mesh structure. For example, the second openings OP2 may be arranged in a matrix structure in the first direction DR1 and the second direction DR2. The second openings OP2 may have the same size. However, the present disclosure is not necessarily limited to the aforementioned example. The second openings OP2 may include second openings OP2 having different sizes.

An example of the structure of the opening OP will be described with reference to FIGS. 8 and 9. FIGS. 8 and 9 illustrate the first portion A1 of the cover film COP.

In an embodiment of the present disclosure, the opening OP may have a shape extending in a given direction (e.g., the first direction DR1).

The opening OP may extend in the same direction as the direction in which the sensing line TMP extends. The opening OP may have a shape extending primarily in the first direction DR1, in a plan view. For example, the opening OP may have a rectangular shape with long sides extending in the first direction DR1. Therefore, the ESD path ESD_P defined by the opening OP may precisely cover the sensing line TMP, so that the sensing line TMP can be effectively protected from ESD.

While various embodiments have been described above, those skilled in the art will appreciate that various modifications, additions and substitutions are possible, without departing from the scope and spirit of the present disclosure.

What is claimed is:

1. A display device, comprising:
a display panel including a first surface and a second surface opposite to the first surface; and
a cover film including a first portion disposed on the first surface of the display panel, a second portion disposed on a side surface of the display panel, the side surface being disposed between the first surface and the second surface and at least a portion of the second portion being bent, and a third portion disposed on the second surface of the display panel,
wherein the cover film comprises a first insulating cover layer, a conductive cover layer disposed on the first insulating cover layer, and a second insulating cover layer disposed on the conductive cover layer, and
wherein the second insulating cover layer includes an opening exposing the conductive cover layer.

2. The display device according to claim 1, wherein the conductive cover layer forms an electro-static discharge (ESD) path to dissipate ESD from along the opening.

3. The display device according to claim 1, wherein the opening is formed in the first portion of the cover film and is absent from each of the second portion of the cover film and the third portion of the cover film.

4. The display device according to claim 1, wherein the opening includes a plurality of openings.

5. The display device according to claim 4, wherein the plurality of openings are arranged in a matrix structure with respect to a first direction and a second direction different from the first direction.

6. The display device according to claim 4, wherein the plurality of openings are sequentially arranged in a given direction.

7. The display device according to claim 4,
wherein the plurality of openings includes at least a first opening and a second opening, and
wherein a size of the first opening is greater than a size of the second opening.

8. The display device according to claim 7,
wherein the first opening includes first side openings and a first intermediate opening between the first side openings,
wherein the first side openings and the first intermediate opening are adjacent to each other, and
wherein a size of each of the first side openings is greater than a size of the first intermediate opening.

9. The display device according to claim 8,
wherein the second opening includes a plurality of second openings, and wherein the plurality of second openings are arranged in a matrix structure with respect to a first direction and a second direction different from the first direction.

10. The display device according to claim 1, wherein the opening comprises only a single opening.

11. The display device according to claim 10, wherein the opening has a shape extending primarily in a given direction.

12. The display device according to claim 1, wherein the first insulating cover layer has a first thickness, and wherein the second insulating cover layer has a second thickness that is less than the first thickness.

13. The display device according to claim 1, further comprising:

a display area, and a non-display area enclosing at least a portion of the display area; and a sensing layer disposed on the display panel, and including a sensing electrode, and a sensing line electrically connected to the sensing electrode, wherein the sensing line is disposed in the non-display area.

14. The display device according to claim 13, wherein the opening is adjacent to the sensing line.

15. The display device according to claim 13, further comprising a polarizing layer disposed on the sensing layer, wherein the sensing line and the polarizing layer overlap each other.

16. The display device according to claim 13, wherein the display panel includes a pixel, wherein the display device further comprises a driving circuit component configured to drive the pixel, and wherein the sensing line is disposed between the display area and the driving circuit component.

17. The display device according to claim 16, wherein the first portion of the cover film covers the driving circuit component.

18. The display device according to claim 1, further comprising:

a circuit substrate disposed on the second surface of the display panel; and a curved film including at least a first portion disposed on the display panel, and at least a second portion disposed circuit substrate, wherein the second portion of the cover film covers the curved film, and wherein the third portion of the cover film covers the curved film and the circuit substrate.

19. The display device according to claim 1, wherein the display device is a windowless structure.

20. A windowless display device, comprising:

a display panel including a first surface and a second surface opposite to the first surface;

a sensing layer disposed on the display panel, and including a sensing electrode, and a sensing line electrically connected to the sensing electrode;

a polarizing layer disposed on the sensing layer; and a cover film, at least a portion of which is disposed on the display panel, wherein the cover film comprises a first insulating cover layer, a conductive cover layer disposed on the first insulating cover layer, and a second insulating cover layer disposed on the conductive cover layer, wherein the second insulating cover layer includes an opening exposing the conductive layer, wherein the opening includes a plurality of openings, and wherein at least some of the plurality of openings are sequentially formed in a direction in which the sensing line extends.

* * * * *